United States Patent [19]
Illegems

[11] Patent Number: 6,100,738
[45] Date of Patent: Aug. 8, 2000

[54] HIGH-SPEED CURRENT SWITCH WITH COMPLEMENTARY STAGES

[75] Inventor: Paul F. Illegems, Albuquerque, N. Mex.

[73] Assignee: Philips Electronics North America Corporation, New York, N.Y.

[21] Appl. No.: 09/218,546

[22] Filed: Dec. 22, 1998

[51] Int. Cl.[7] ...................................................... H03K 5/01
[52] U.S. Cl. ......................... 327/165; 327/170; 327/103; 327/389
[58] Field of Search ..................................... 327/103, 165, 327/170, 374, 376, 389, 436; 326/87

[56] References Cited

U.S. PATENT DOCUMENTS

| 5,502,414 | 3/1996 | Tran et al. ............................... 327/434 |
| 5,534,803 | 7/1996 | Correale, Jr. et al. .................. 327/108 |
| 5,548,240 | 8/1996 | Bayer ....................................... 327/432 |
| 5,825,206 | 10/1998 | Krishnamurthy et al. ................ 326/81 |
| 5,982,206 | 11/1999 | Tachio et al. ............................ 327/103 |

FOREIGN PATENT DOCUMENTS

0722221A2   7/1996   European Pat. Off. ..... H03K 17/041

Primary Examiner—Terry D. Cunningham
Attorney, Agent, or Firm—Robert J. Kraus

[57] ABSTRACT

A high-speed current switch has complementary switching stages for collectively producing a square-wave output current. Spurious currents and charging delays caused by intrinsic capacitances in one stage substantially cancel those in the other stage.

4 Claims, 3 Drawing Sheets

HIGH-SPEED CURRENT SWITCH WITH COMPLEMENTARY STAGES

BACKGROUND OF THE INVENTION

1. Field of the Invention

The invention relates to a high-speed current switch, and particularly to such a switch that does not require an external bias-voltage source.

2. Description of Related Art

European Patent Application 722221, published on Jul. 17 1996, describes a high-speed current switch that needs no external bias source for transistors in the switch. As described in that patent, an external reference bias source with a low output impedance had been used in prior art current switches for rapidly charging and discharging intrinsic capacitances in the current switch, thereby decreasing the settling time of the switched current. This increases the cost of the switch and, in integrated circuit implementations, also increases the number and complexity of conductors that must be provided for external connections. European Patent Application 722221 proposes relatively simple current-switch circuitry that does not require such an external bias source.

SUMMARY OF THE INVENTION

It is an object of the invention to provide a current switch which is relatively simple, is especially useful in integrated circuit implementations, and has an improved output current waveform.

In accordance with the invention, a current switch for producing a square wave output current in response to a square wave input signal comprises:

- a plurality of terminals including a first input terminal for receiving the input signal; an output terminal for producing the square wave output current; first and second power supply terminals; and a biasing terminal;
- a first current-switching stage including first and second transistors; the first transistor having a first terminal coupled to the biasing terminal, a second terminal coupled to the output terminal, and a third terminal; the second transistor having a first terminal coupled to the first input terminal, a second terminal coupled to the third terminal of the first transistor, and a third terminal coupled to the second power supply terminal;
- a second current-switching stage including third and fourth transistors; the third transistor having a first terminal coupled to the first input terminal, a second terminal coupled to the output terminal, and a third terminal; the fourth transistor having a first terminal coupled to the biasing terminal, a second terminal coupled to the third terminal of the third transistor, and a third terminal coupled to the second power supply terminal; and
- a biasing circuit including a current source for supplying a predetermined current to the biasing terminal and at least one transistor having first and second terminals coupled to the biasing terminal, and a third terminal coupled to one of the first and second power supply terminals, the at least one transistor forming a current mirror with at least one of the first and fourth transistors.

DESCRIPTION OF THE PREFERRED EMBODIMENTS

First Embodiment

Figure 1A:
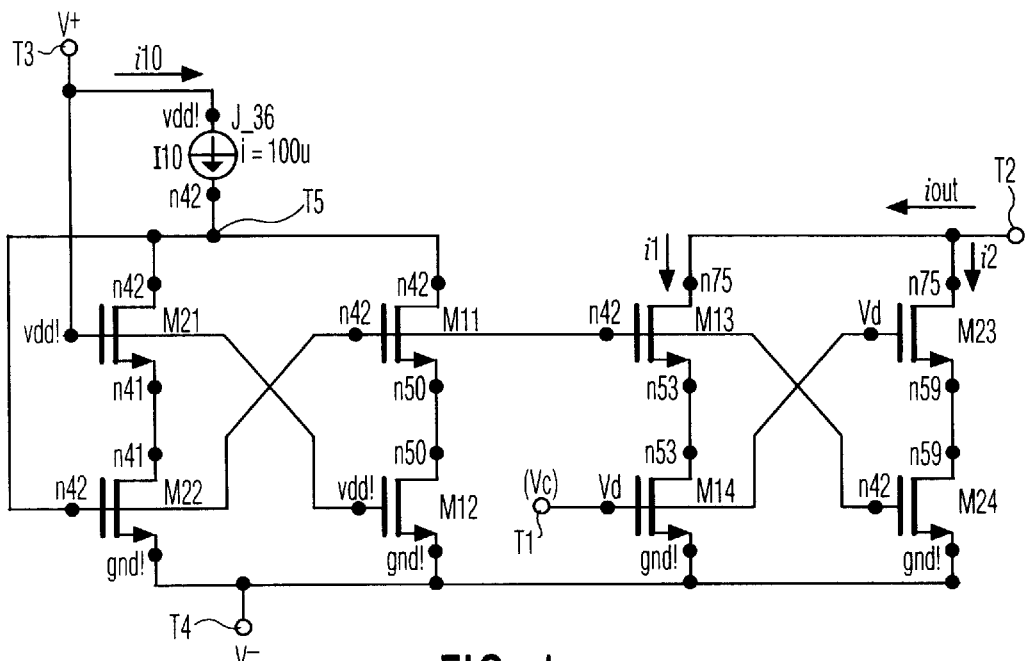
FIG. 1a is a schematic diagram of a first embodiment of a current switch in accordance with the invention.

The first embodiment of the current switch, illustrated in FIG. 1a, includes a first current-switching stage having transistors M13 and M14, a complementary second current-switching stage having transistors M23 and M24, and a biasing circuit having a current source I10, a first pair of transistors M11, M12, and a second pair of transistors M21, M22. In this exemplary embodiment, all of the transistors are NMOS type. The current switch also includes an input terminal T1 for the application of a switching signal, an output terminal T2 for receiving the current to be switched, and terminals T3 and T4 for connection to positive and negative supply voltages $V^+$ and $V^-$, respectively. In this exemplary embodiment, nominal supply voltages are $V^+=3.3$ volts and $V^-=0$ volt.

In the first current-switching stage, the transistors M13 and M14 are mutually electrically connected in series, with the drain terminal of transistor M13 connected to terminal T2, the source terminal of transistor M13 connected to the drain terminal of transistor M14, and the source terminal of transistor M14 connected to terminal T4. Similarly, in the second current-switching stage, the transistors M23 and M24 are mutually electrically connected in series, with the drain terminal of transistor M23 connected to terminal T2, the source terminal of transistor M23 connected to the drain terminal of transistor M24, and the source terminal of transistor M24 connected to terminal T4. Thus, the first and second current-switching stages are electrically connected in parallel with each other between the output terminal T2 and the negative supply terminal T4. Additionally, the gate terminals of transistors M14 and M23 are electrically connected to the input terminal T1.

In the biasing circuit, the current source I10 is electrically connected between terminal T3 and a terminal T5. This current source is shown symbolically, but is formed by any current source circuit (even a single transistor) which produces a predetermined constant current i10. Further, the first pair of transistors M11, M12 are electrically connected in series, with the drain and gate terminals of transistor M11 mutually connected to terminal T5 (thereby causing this transistor to operate as an MOS diode), the source terminal of transistor M11 connected to the drain terminal of transistor M12, and the source terminal of transistor M12 connected to terminal T4. Transistor M12 operates essentially as a resistor. Similarly, the second pair of transistors M21, M22 are electrically connected in series, with the drain terminal of transistor M21 connected to terminal T5, the source terminal of transistor M21 connected to the drain terminal of transistor M22, and the source terminal of transistor M22 connected to terminal T4. In this pair, transistor M21 operates as a resistor and transistor M22 operates as an MOS diode. Thus the first and second pairs of transistors in the biasing circuit are electrically connected in parallel with each other between terminal T5 and the negative supply terminal T4. Additionally, terminal T5 is electrically connected to the gate terminals of transistors M11 and M22, in the biasing circuit, and to the gate terminals of transistors M13 and M24, in the first and second current-switching stages. Finally, the gates of the transistors M12 and M21, in the biasing circuit, are electrically connected to terminal T3. The pairs of transistors M11, M12 and M21, M22 in the biasing circuit have gate dimensions which are proportionate to those of respective transistors M13, M14 and M23, M24 in the first and second switching stages.

Each of the current-switching stages has an ON state, when it is conducting current, and an OFF state, when it is not conducting current. The biasing circuit functions to define the steady-state currents passing through the first and second current-switching stages, when each of these stages is in its ON state. More particularly, transistor M11 operates together with transistor M13 of the first current-switching stage to form a first current mirror. This current mirror functions to maintain a predetermined ratio between the currents flowing in these two transistors. As is well known in the art, this ratio is primarily determined by the relative dimensions (i.e. the lengths and widths) of the gates in the two transistors. Similarly, transistor M22 operates together with transistor M24 of the second current-switching stage to form a second current mirror, which also functions to maintain a predetermined ratio between the currents flowing in these two transistors. Transistors M12 and M21 in the biasing circuit are added to make this circuit symmetrical with the current-switching stages. Note that each of these transistors is electrically connected to terminal T3, to which the supply voltage V⁻ is applied, and each functions essentially as a resistor. Similarly, each of comparable transistors M14 and M23 in the first and second current-switching stages is electrically connected to terminal T1, to which the switching signal $V_c$, having a predetermined voltage level, is applied to switch transistors M14 and M23 into their ON states.

In this embodiment, the transistors M11, M22 in the biasing circuit have gate dimensions which are matched to each other. Also the transistors M13, M24 in the current-switching stages have gate dimensions which are matched to each other, but are substantially larger than those of the transistors in the biasing circuit. The gate dimensions of the remaining transistors M12, M21, M14, M23 are not critical. However, the gate dimensions of all four of the transistors in the current-switching stages preferably are selected to minimize parasitic capacitances and to establish acceptably high OFF state resistances and acceptably low ON state resistances.

In an exemplary current switch which has been built and tested, the gate dimensions of the four biasing circuit transistors are matched to each other, the gate dimensions of the four current-switching stage transistors are matched to each other, and the relative gate lengths/widths of the current-switching stage transistors and the biasing circuit transistors are $^{40.0}/_{1.2}$ and $^{12.5}/_{1.2}$, respectively. Because of the larger gate dimensions of the transistors in the current-switching stages, the current carried by each of current-switching stage transistors M13 and M24 is approximately one-hundred times the current carried by each of biasing circuit transistors M11 and M22 when the same bias voltage is applied to the gates of all four of these transistors.

OPERATION

In operation, the output terminal T2 of the current switch is used to sink current from an apparatus which requires a close-to-ideal square current pulse for optimum operation. Some examples of such apparatus are high-speed logic circuits, precision current mirrors, integrators and A/D converters. Whenever the switching signal $V_c$, in the form of a square-wave voltage pulse, is applied to the input terminal T1, the first and second current-switching stages cooperate to provide a square-wave current pulse $i_{out}$ at the output terminal T2. These two stages are mutually complementary, in the sense that spurious currents and charging delays caused by intrinsic capacitances in the transistors of the two stages cancel each other.

Figure 1B:
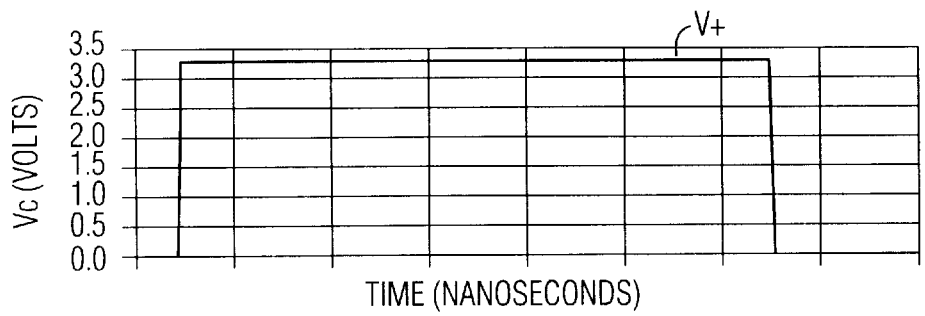
FIGS. 1b and 1c are graphs illustrating operation of the first embodiment.
Figure 1C:
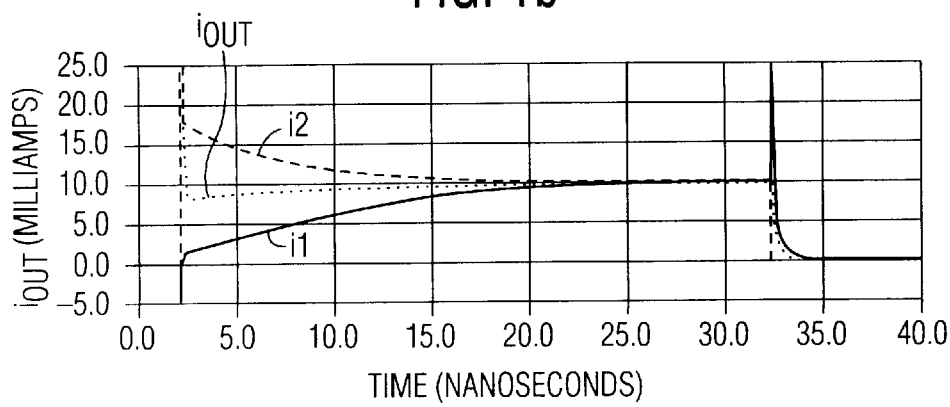

The complementary operation of the first and second current-switching stages is illustrated in FIGS. 1b and 1c. FIG. 1b is a graph of an input signal $V_c$ over a period of time, while FIG. 1c is a graph of three different current pulses over the same period of time. Specifically, in FIG. 1c the three currents are the output current $i_{out}$, a current i1 passing through the first current-switching stage, and a current i2 passing through the second current-switching stage. Note that, at the leading edge of the input signal $V_c$, the first stage current i1 increases gradually, but the second stage current i2 overshoots the steady state value and then decreases gradually. Similarly, at the trailing edge of the input signal $V_c$, the first stage current i1 decreases more gradually to the zero level than the second stage current i2.

Second Embodiment

Figure 2A:
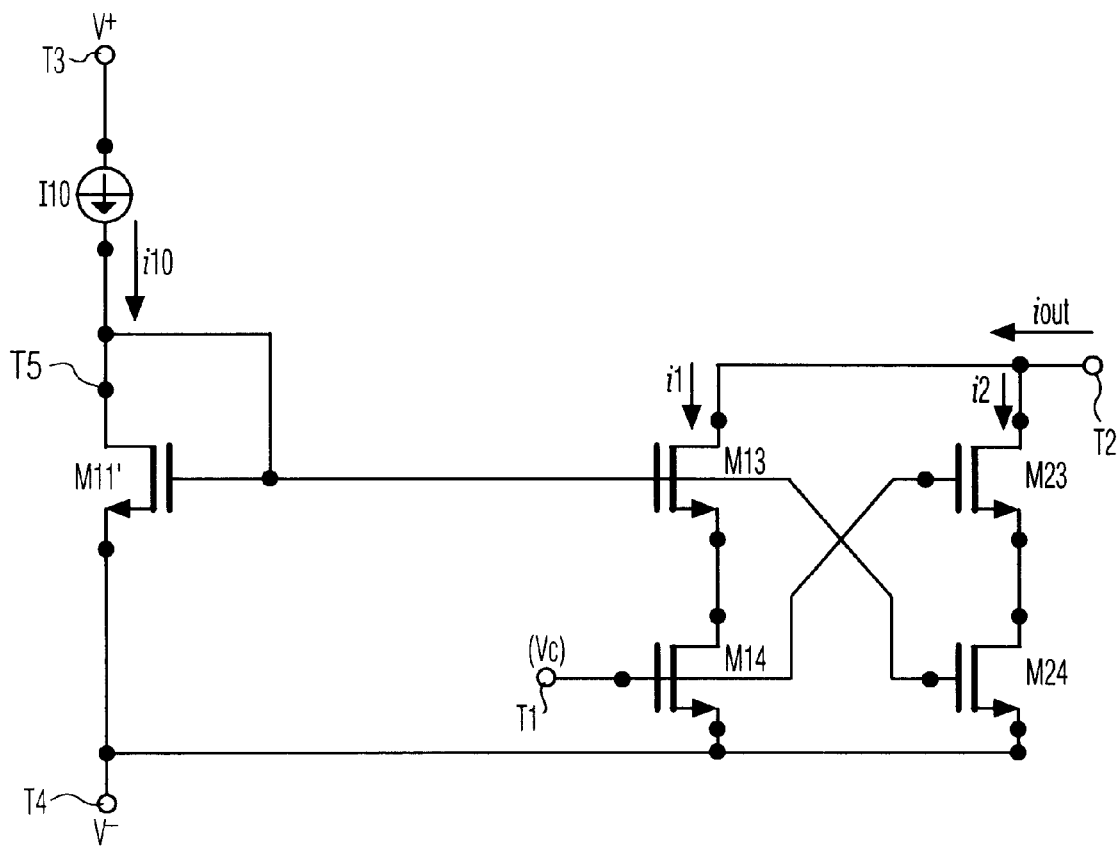
FIG. 2a is a schematic diagram of a second embodiment of a current switch in accordance with the invention.

The second embodiment of the current switch, shown in FIG. 2a, is a simplification of the first embodiment. It is substantially identical to the first embodiment, except that the biasing circuit has been simplified to include only the current source I10 electrically connected in series with an NMOS transistor M11' between terminal T3 and terminal T4. The gate terminal of transistor M11' is electrically connected to the gates of transistors M13 and M24, such that these three transistors form a current mirror. For the same values of currents i10, i1 and i2, the gate length of transistor M11' must be approximately twice that of transistor M11, if they have identical gate widths.

Figure 2B:
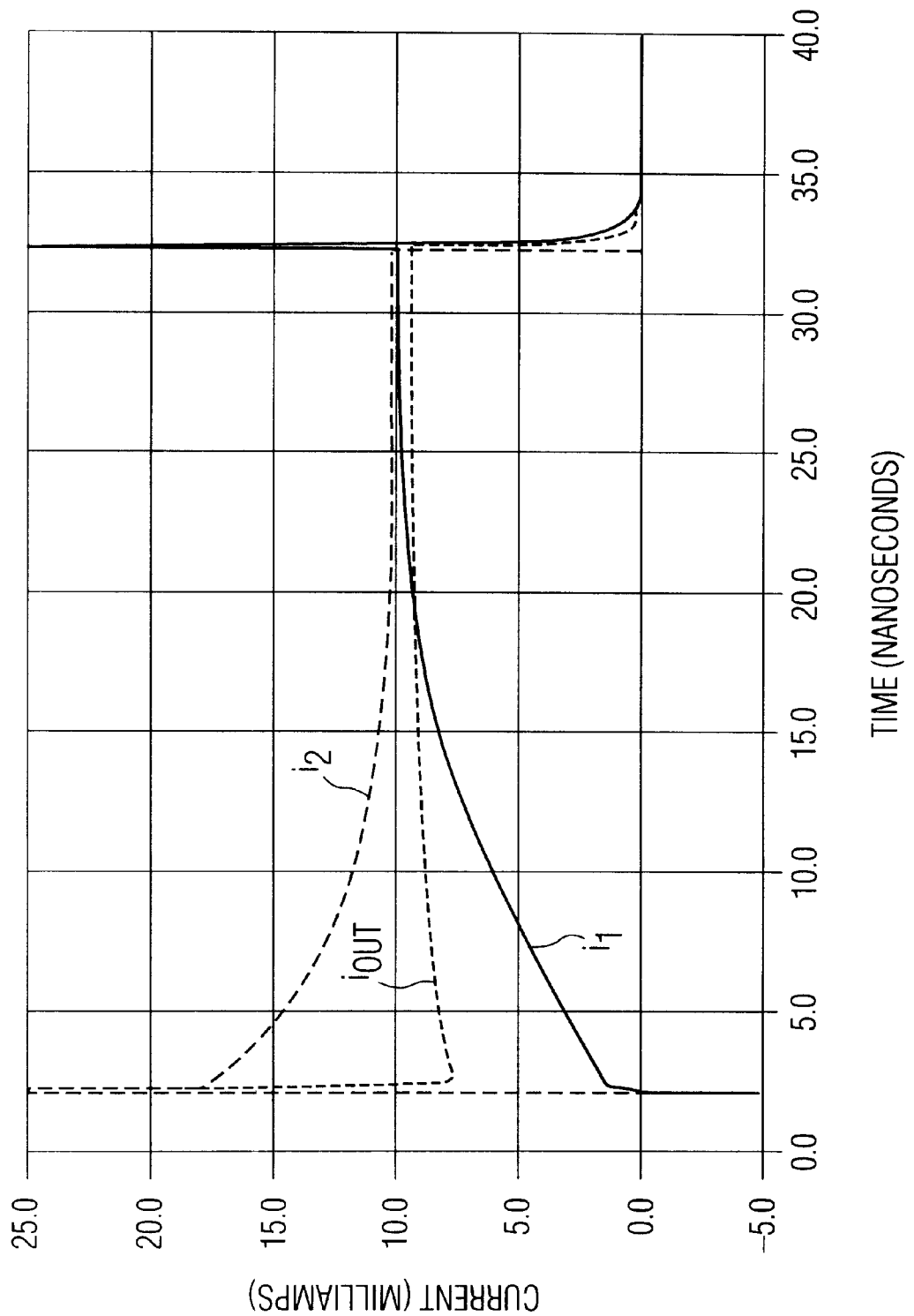
FIG. 2b is a graph illustrating operation of the second embodiment.

FIG. 2b illustrates the operation of the simplified embodiment of FIG. 2a. Note that the only significant difference is a slightly lower steady-state current level for the output current $i_{out}$.

What is claimed is:

1. A current switch for producing a square wave output current in response to a square wave input signal, said current switch comprising:

a. a plurality of terminals including a first input terminal (T1) for receiving the input signal; an output terminal (T2) for producing the square wave output current; first (T3) and second (T4) power supply terminals; and a biasing terminal (T5);

b. a first current-switching stage including first (M13) and second (M14) transistors; said first transistor having a first terminal coupled to the biasing terminal, a second terminal coupled to the output terminal, and a third terminal; said second transistor having a first terminal coupled to the first input terminal, a second terminal coupled to the third terminal of the first transistor, and a third terminal coupled to the second power supply terminal;

c. a second current-switching stage including third (M23) and fourth (M24) transistors; said third transistor having a first terminal coupled to the first input terminal, a second terminal coupled to the output terminal, and a third terminal; said fourth transistor having a first terminal coupled to the biasing terminal, a second terminal coupled to the third terminal of the third transistor, and a third terminal coupled to the second power supply terminal; and d. a biasing circuit including a current source (I10) for supplying a predetermined current to the biasing terminal and at least one transistor (M11) having first and second terminals coupled to said biasing terminal, and a third terminal coupled to one of said first and second power supply terminals, said at least one transistor forming a current mirror with at least one of said first and fourth transistors.

2. A current switch as in claim 1 where the at least one transistor comprises a fifth transistor (M11') having a first terminal and a second terminal, each coupled to the biasing terminal and to the first terminal of the first transistor and to the first terminal of the fourth transistor, and having a third terminal coupled to the second power supply terminal.

3. A current switch as in claim 1 where the at least one transistor comprises:

a. a fifth transistor (M11) having a first terminal and a second terminal, each coupled to the biasing terminal and to the first terminal of the first transistor and to the first terminal of the fourth transistor, and having a third terminal;

b. a sixth transistor (M12) having a first terminal coupled to the first power supply terminal, a second terminal coupled to the third terminal of the fifth transistor, and a third terminal coupled to the second power supply terminal;

c. a seventh transistor (M21) having a first terminal coupled to the first power supply terminal, a second terminal coupled to the biasing terminal, and a third terminal; and d. an eighth transistor (M22) having a first terminal coupled to the biasing terminal, a second terminal coupled to the third terminal of the seventh transistor, and a third terminal coupled to the second power supply terminal.

4. A current switch as in claim 1 where the third terminal of the at least one transistor is coupled to the second power supply terminal.

* * * * *